United States Patent [19]

Nomura et al.

[11] Patent Number: 4,680,469
[45] Date of Patent: Jul. 14, 1987

[54] FOCUSING DEVICE FOR A TELEVISION ELECTRON MICROSCOPE

[75] Inventors: Setsuo Nomura, Tokyo; Shigeto Isakozawa, Katsuta, both of Japan

[73] Assignee: Hitachi, Ltd., Tokyo, Japan

[21] Appl. No.: 766,272

[22] Filed: Aug. 16, 1985

[30] Foreign Application Priority Data

Aug. 17, 1984 [JP] Japan .................. 59-170471
Sep. 19, 1984 [JP] Japan .................. 59-194672

[51] Int. Cl.⁴ .............................................. H01J 37/26
[52] U.S. Cl. .................................. 250/311; 250/306; 250/398
[58] Field of Search ........... 250/311, 306, 307, 396 R, 250/397, 398

[56] References Cited

U.S. PATENT DOCUMENTS

| | | | |
|---|---|---|---|
| 3,597,609 | 8/1971 | Anger | 250/311 |
| 4,097,740 | 6/1978 | Müller et al. | 250/311 |
| 4,379,231 | 4/1983 | Shii et al. | 250/311 |
| 4,399,360 | 8/1986 | Fotino | 250/311 |
| 4,514,629 | 4/1985 | Smith et al. | 250/311 |

FOREIGN PATENT DOCUMENTS 53-15738  2/1978  Japan ................... 250/311

Primary Examiner—Carolyn E. Fields
Assistant Examiner—Paul A. Guss
Attorney, Agent, or Firm—Antonelli, Terry & Wands

[57] ABSTRACT

Focusing device for a transmission type electron microscope displaying an enlarged image on a television monitor, in which the incident angle of the electron beam on the sample is varied with a constant frequency and the focal length of the objective electron lens is so controlled that there is no change between the image observed before change of the incident angle of the electron beam and that observed thereafter, wherein timing for changing the incident angle is set during the blanking intervals of the vertical synchronizing signal of the television so that fluctuations of the image can be clearly detected.

8 Claims, 5 Drawing Figures

FOCUSING DEVICE FOR A TELEVISION ELECTRON MICROSCOPE

BACKGROUND OF THE INVENTION

1. Field of the Invention

This invention relates to a focusing device for a television electron microscope and in particular to an improved focusing device for an electron microscope permitting observation of an enlarged image through a television.

2. Description of the Related Arts

Heretofore, a device usually called a wobbler has been used as a focusing device for a general transmission type electron microscope. A focusing device for a transmission type electron microscope using such a wobbler has been disclosed in Japanese Patent Application, Un-examined Publication No. 78/15738 (Post-examination Publication No. 83/24899), filed on July 28, 1976 in Japan by the same applicant as this application and laid open on Feb. 14, 1978.

This wobbler is a device varying in time the incident angle of an electron beam projected on a sample with respect to it. It utilizes the fact that, when the focal point of the electron microscope is not well adjusted, the image of the sample enlarged on the image formation plane is seen fluctuating, as the incident angle varies, and when the focal point is well adjusted, the position of the image doesn't change and it is seen standing still, even if the incident angle varies. Consequently, the user observes movement of the image of the sample on a fluorescent plate, while operating the wobbler and adjusts the focal point by varying current flowing in the objective lens of the transmission type electron microscope and thus regulating the focal length so that the movement of the image can be no more observed. This method is widely utilized as a simple focusing method. The application of this device to a television electron microscope has given rise to a problematical point that, when the incident angle of the electron beam varies during the horizontal scanning of the television, if the focal point is not well adjusted, fluctuations of the image on the display of the television are observed in the form of a fuzziness of the image and therefore it is difficult to adjust the focal point with a high precision.

SUMMARY OF THE INVENTION

An object of this invention is to provide a device indicating clearly fluctuations of the image due to variations of the incident angle of the electron beam in a television electron microscope and thus enabling focusing of the electron beam with a high precision. Another object of this invention is to provide a device, in which fluctuations of the image formed through television are detected not with the naked eye but electrically and the focusing is performed in such a manner that the fluctuations disappear.

In order to achieve these objects, a focusing device for a television electron microscope according to this invention comprises a means for varying alternately the incident angle of the electron beam on a sample, depending on incident angle control signals having a predetermined frequency; electron lenses for forming an image at a predetermined position with electrons passing through the sample; a television apparatus visualizing the formed image and displaying it; a focal point adjusting device for forming the enlarged image of the sample at the predetermined position by adjusting the focal length of the electron lenses; and a signal generator for supplying vertical scanning signals to the television apparatus, and at the same time generating the incident angle control signals in synchronism with the vertical scanning signals to be fed to the means for varying the incident angle, whereby fluctuations of the image due to variations of the incident angle of the electron beam can be clearly detected.

DESCRIPTION OF THE PREFERRED EMBODIMENTS

Figure 1:
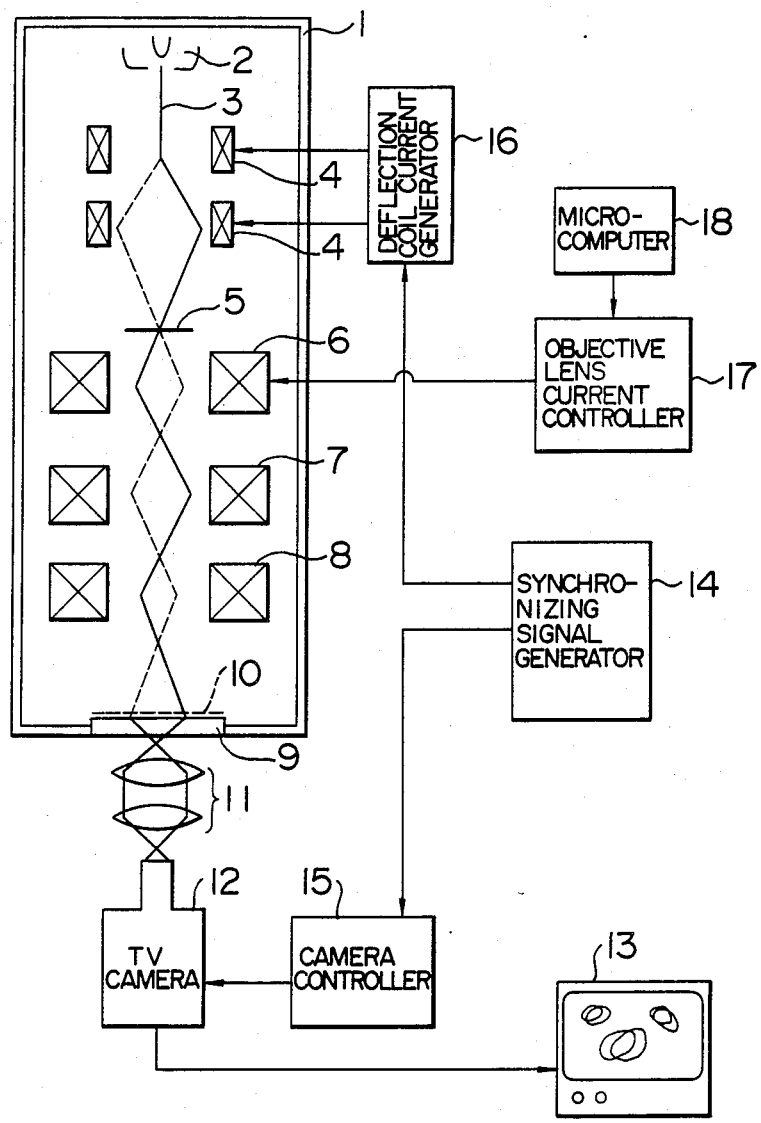
FIG. 1 is a constructional scheme illustrating an embodiment of focusing devices for a television electron microscope according to this invention.

At first, the first embodiment of this invention will be explained, referring to FIGS. 1 and 2. In FIG. 1, the electron beam 3 emitted by the electron gun 2 in the principal part of an electron microscope 1 is deflected by varying the current flowing in the deflection coil 4 in the wobbler device and thus varies the incident angle of the electron beam 3 entering the sample 5 with a frequency f. The objective lens 6, the intermediate lens 7 and the projection lens 8 make the electron beam, which has passed through the sample 5, form an image on the fluorescent plane 10 disposed on a glass plate 9. This image is transformed by an optical lens system 11 into an image on the face plate of the image pick-up tube of a television camera (hereinbelow abbreviated to TV camera), which is then transformed into electric signals and displayed on a television monitor 13. At this moment, if the electron beam of this transmission type electron microscope is well focused, the image on the fluorescent plane 10 doesn't move, even when the incident angle of the incident electron beam 3 on the sample varies, but if it is not well focused, the image fluctuates with the frequency f. According to this invention, the camera controller 15 for the TV camera and the deflection coil current generator 16 of the wobbler device are controlled by synchronizing signals generated by a synchronizing signal generator 14. That is, the synchronizing signal generator 14 generates synchronizing signals having the frequency f and those having a frequency Nf (N is an arbitrary integer), this is N times as great as the former, and controls the deflection coil current and the vertical scanning current for the TV camera by using these synchronizing signals. In this way, it is possible to vary the angle of the incident electron beam during the blanking intervals of the TV camera.

Figure 2:
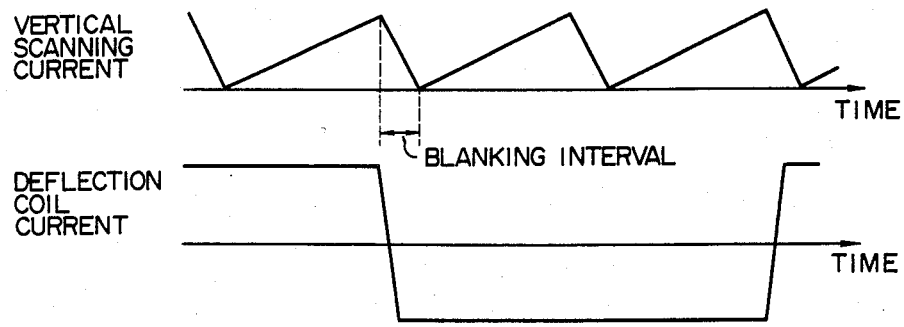
FIG. 2 shows waveform of the vertical scanning current and that of the current flowing in the electron beam deflection coil of the television camera indicated in the embodiment indicated in FIG. 1.

FIG. 2 is a diagram, in which waveform of the vertical scanning current of the TV camera and that of the deflection coil current for the wobbler device according to this invention are indicated in the function of the elapsed time. As it is seen in FIG. 2, in the focusing device according to the invention the waveform of the deflection coil current for the wobbler device is changed during the blanking intervals of the waveform of the vertical scanning current for the TV camera. Accordingly, fuzziness produced by deviation of the image during the change of the incident angle is not observed at all in the image on the television monitor 13 and if the focal point of the transmission type electron microscope is not well in focus, a fluctuating doubled image is formed. It is sufficient for the observer to adjust an objective lens current controller 17 in such a manner that the doubled image becomes a steady single one. When the image on the television monitor 13 is not doubled, but seen to be single under working of the wobbler device, the focal point of this transmission type electron microscope is in focus with the exception of negligible deviations of the focal point due to aberrations of the lens system.

In addition, in the embodiment indicated in FIG. 1, a microcomputer 18 is connected to the objective lens current controller 17. In general, in the case where a low contrast sample such as a biological sample is observed, in order to emphasize the contrast, the objective lens 6 is sometimes so adjusted that the focal point is slightly deviated from the state in focus. This deviation from the focus is previously experimentally determined and stored in a memory device (not shown) of the microcomputer 18. In the case where it is desired to obtain a high contrast image, after that the focal point has been once adjusted in the manner described above, the objective lens is energized with a current obtained by subtracting a value corresponding to a desired deviation from the objective lens current necessary to the adjusting of the focal point according to a command coming from the microcomputer 18.

Now, another embodiment of this invention will be explained, referring to FIGS. 3 to 5.

Although in the embodiment described above, the focusing is effected in such a manner that the operator regulates the objective lens current controller 17 while observing the image on the television monitor 13 so that a single image is obtained, in the second embodiment, the objective lens current controller 17 has not recourse to the adjustment with the naked eye, but it is controlled in such a manner that an image after change of the incident angle of the electron beam is compared with that obtained therebefore in the form of electric signals and that they agree with each other. More concretely speaking, the particularity of this embodiment consists in that images obtained before and after change of the incident angle of the electron beam are stored in separate image memories and that the degree of agreement of these two images is obtained by an operation comparing pixels corresponding to each other in intensity. This embodiment has an effect that even if the electron microscope is nearly in focus so that movement of the image is small, focusing can be effected accurately and surely.

Figure 3:
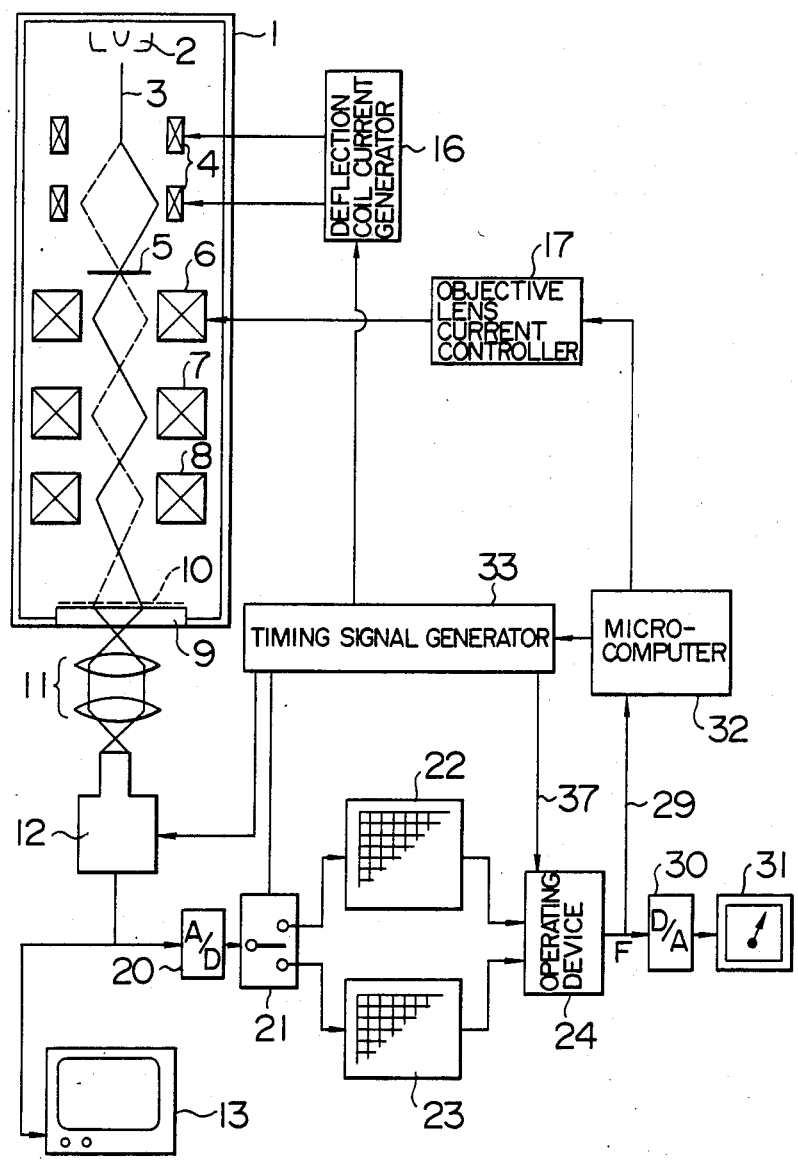
FIG. 3 is a constructional scheme illustrating another embodiment of this invention.

In FIG. 3, any constituent parts having reference numerals, which are used in FIG. 1 in common, represent the corresponding ones in FIG. 1. Since the deflection coil current generator 16 acts in the same manner as in the embodiment indicated in FIG. 1, as far as an enlarged image is displayed in the television monitor 13 while varying the incident angle of the electron beam by controlling the current in the deflection coil 4, the explanation therefor will be omitted.

As stated already, in the case where the microscope is well in focus, even if the incident angle of the electron beam on the sample is varied by the wobbler, the image picked-up by the television camera 12 doesn't fluctuate, but if the microscope is out of focus, the image on the fluorescent plane 10 fluctuates and thus the image picked-up by the television camera 12 varies, too. Consequently, if the degree of agreement of the image after change of the incident angle of the electron beam with that observed therebefore can be detected, it is possible to know whether the electron microscope is well in focus or not. In order to examine it, image signals of the images before and after change of the incident angle of the electron beam are stored in image memories 22 and 23, respectively, through an analogue/digital (A/D) converter 20 and a commutating switch 21 and a signal F (degree of agreement) indicating whether the contents of these memories are identical or not is produced by an operating device 24. This signal F enters either a meter 31 through a digitalanalogue (D/A) converter 30 or a microcomputer 32 through a signal line 29 and indicates in the form of the degree of agreement of images whether the electron microscope is in focus, as stated later.

Figure 4:
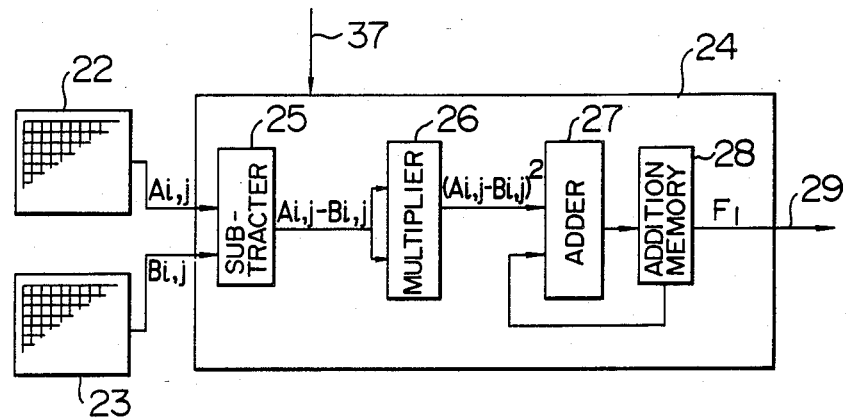
FIG. 4 is a block diagram indicating an example of an operating device for judging focus of the electron microscope.

FIG. 4 shows an example of operating devices calculating the degree of agreement for judging whether the microscope is in focus, which can be used for this invention. The method for storing the images before and after change of the incident angle of the electron beam through the A/D converter 20 and the commutating switch 21 is as follows. Brightness of each of the pixels is stored, in the form of information expressed e.g. in 8 bits per pixel, in a memory position of address (i,j) in the image memories, corresponding to the two-dimensional arangement of the pixels. The brightness at an address (i,j) of the image stored in the memory 22 before change of the incident angle of the electron beam is denoted by $A_{i,j}$ and brightness at an address (i,j) of the image stored in the memory 23 after change of the incident angle of the electron beam is denoted by $B_{i,j}$. The operating device 24 reads out $A_{i,j}$ and $B_{i,j}$ changing the address of the pixel i,j one after another according to the timing signal inputted through a timing signal line 37 and performs operations. The signals $A_{i,j}$ and $B_{i,j}$ are transformed at first into $(A_{i,j}-B_{i,j})$ in a subtracter 25, which is then squared in a multiplier 26.

Further, this value is calculated for all the addresses (i,j) and the signals thus obtained are added by using an adder 27 and an addition memory 28. Thus, in a signal line 27 appears a signal:

$$F_1 = \sum_{i,j}(A_{i,j}-B_{i,j})^2 \quad (1)$$

$F_1$ is zero, only when $A_{i,j}$ and $B_{i,j}$ are equal to each other for all i and j, and it is not zero in the other cases. That is, if the image stored before change of the incident angle of the electron beam coincides with that stored after the change, $F_1$ is zero, and if they are different because of deviation of the focal point, $F_1$ is not zero. This signal $F_1$ enter a meter 31 through a D/A converter 30. When the change of the incident angle of the electron beam has been repeated while varying the objective lens current and it has been so set that the pointer of the meter 31 indicates an extremely small value, then the television electron microscope is in focus.

In this embodiment, the objective lens current is varied stepwise, starting from a low value, through the objective lens current controller 17 under the control by the microcomputer 32. The incident angle of the electron beam is changed at each step by driving the deflection coil current generator 16 under the control by the microcomputer 32 and the timing signal generator 33. The images before and after the change are stored in the image memories 22 and 23, respectively, and used for calculating $F_1$. The value $F_1$ is inputted in the microcomputer 32 and if $F_1$ is zero or very small, the objective lens current is no more changed. That is, at this moment, the electron microscope is in focus, and therefore focusing is effected without necessitating that the operator judges the difference between the two images with the naked eye. This is done with a very high precision.

Figure 5:
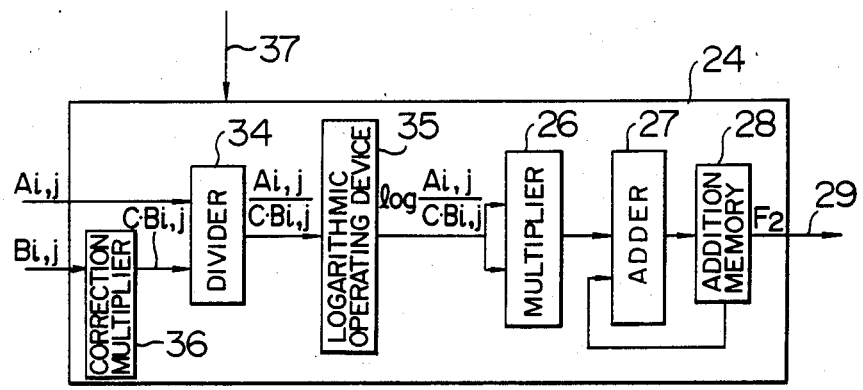
FIG. 5 is a block diagram indicating another example of the same operating device.

FIG. 5 indicates another example for the operating device 24. In this example, the inputs are $A_{i,j}$ and $B_{i,j}$ just as for the example indicated in FIG. 4, but $B_{i,j}$ is multiplied by a constant (C) in a correction multiplier 36. Since, if the optical axis of the electron beam projection system is not set perfectly correctly, when the incident angle of the electron beam on the sample is changed, the intensity of the projected electron beam can vary, too, and this multiplication serves as previous compensation of influences of this variation in intensity. That is, since this variation in intensity of the electron beam due to the fact that the optical axis is not set correctly produces errors in calculation result on the degree of agreement $F_2$, the correction factor C is obtained previously experimentally.

The signals $A_{i,j}$ and $C \cdot B_{i,j}$ pass through a divider 34 and then are transformed into a signal log ($A_{i,j}/C \cdot B_{i,j}$) by a logarithmic operating device 35. The function of the multiplier 26, the adder 27 and the addition memory is just the same as that in the example indicated in FIG. 4. In this example, a signal $$F_2 = \sum_{i,j}(\log A_{i,j}/C \cdot B_{i,j})^2 \quad (2)$$

appears in the signal line 29. This signal $F_2$ also is zero, only when $A_{i,j}$ and $B_{i,j}$ are equal to each other for all i and j. That is, it is possible to judge with a high precision also by using $F_2$ whether the focal point of the electron microscope is well in focus. Further, also in the case where this correction multiplier 36 is introduced in the operating device indicated in FIG. 4, the same correction effect as that obtained for the example indicated in FIG. 5 can be obtained. This operating device in FIG. 5 is better than the example indicated in FIG. 4 in the fact that precision remains always unchanged, because the degree of agreement $F_2$ is a normalized value, independent of the intensity of the electron beam.

In addition, in equations (1) and (2), the addition with respect to (i,j) is not effected necessarily for all the (i,j) forming the image. For example it can be effected for (i,j) within a rectangular or linear region, which is a part corresponding to images before or after change of the incident angle of the electron beam. In this way, $F_1$ and $F_2$ can be calculated by using pixels in an arbitrary region, by the method that a sampling region of the image is previously specified in the microcomputer 32 and that the microcomputer 32 makes a timing signal generator feed the switch 15 with timing signals corresponding to this region.

Furthermore, although, in the embodiments stated above, a method by which the pixels are compared one after another, the degree of agreement can be obtained by dividing the image into several blocks and by comparing the intensities of signals in corresponding blocks.

That is, the degree of agreement $F_1$ or $F_2$ is calculated by dealing with a plurality of pixels constituting a predetermined region of the image as a block and by making the brightness of the block before and after change of the incident angle corespond to A and B, respectively, in equations (1) and (2). In this way, even if brightness of the pixels is low, the degree of agreement can be calculated without reducing S/N.

As stated above, according to the second embodiment, focusing can be effected with a very high precision with respect to the prior art techniques, because fluctuations of the image on the monitor television in a television electron microscope can be judged without recourse to the naked eye. Furthermore, the function of the television electron microscope to follow variations of the sample with a high fidelity is not interfered, because the image of the whole sample is displayed continuously on the monitor television 13 during the focusing operation described above.

We claim:

1. A focusing device for a transmission type electron microscope displaying an enlarged image of a sample on a television, comprising:

means for changing alternately the incident angle of the electron beam on the sample in response to incident angle control signals having a predetermined frequency;

electron lens means for focusing the electron beam at a predetermined position by deflecting the electron beam passing through the sample;

a television apparatus for visualizing and displaying the image thus formed;

a focal point adjustment means for adjusting the focal length of said electron lens means on the basis of the image of said television apparatus and for forming an enlarged image of the sample at said predetermined positon; and a signal generator means for feeding said television apparatus with vertical scanning signals and said means for changing alternately the incident angle of the electron beam with incident angle control signals having said predetermined frequency in synchronism with said vertical scanning signals, said signal generator means generating said incident angle control signals in such a manner that said incident angle of the electron beam varies during the blanking intervals of said vertical scanning signals.

2. A focusing device for a transmission type electron microscope according to claim 1, wherein said focusing device further comprises a microcomputer; the microcomputer having memory means and calculating means; predetermined signals for varying by a small amount the focal length of said electron lens means being stored in said memory means; said calculating means subtracting said predetermined signals for varying by a small amount from control signals coming from said focal point adjustment means, when said electron lens means forms an image at said predetermined position, and driving said electron lens means in response to signals thus obtained.

3. A focusing device for a transmission type electron microscope according to claim 1, wherein said focusing device further comprises image memory means for storing images formed by said television apparatus, said image memory means storing images before and after change of said incident angle of the electron beam; and operating means for comparing the two stored images and calculating the degree of agreement of said two images; wherein said focal point adjustment means regulates the focal length of said electron lens means, depending on said degree of agreement.

4. A focusing device for a transmission type electron microscope according to claim 3, wherein said image memory means divides the image picked-up by said television apparatus into a predetermined number of pixels and stores their brightness and said operating means compares the brightness of each of the pixels on a predetermined region of the image after change of said incident angle of the electron beam with the corresponding one obtained therebfore.

5. A focusing device for a transmission type electron microscope according to claim 4, wherein said operating means calculates said degree of agreement in such a manner that the squares of the difference between the brightness of each of the pixels before change of said incident angle and that of the corresponding pixel obtained thereafter are calculated for all the pixels in a predetermined region and the results thus obtained are added together.

6. A focusing device for a transmission type electron microscope according to claim 4, wherein said operating means calculates said degree of agreement in such a manner that the brightness of each of the pixels before change of said incident angle is divided by that of the corresponding pixel obtained thereafter; the logarithm of an absolute value thus obtained is calculated and then squared the same operation is repeated for all the pixels in a predetermined region of said image and the results thus obtained are added together.

7. A focusing device for a transmission type electron microscope according to claim 5, wherein said operating means comprises a correction multiplier, which multiplies the value representing the brightness of each of the pixels after change of said incident angle by a predetermined factor such that variations in intensity of the electron beam due to disagreement of optical axes of electron lenses of said electron microscope are compensated.

8. A focusing device for a transmission type electron microscope according to claim 6, wherein said operating means comprises a correction multiplier, which multiplies the value representing the brightness of each of the pixels after change of said incident angle by a predetermined factor such that variations in intensity of the electron beam due to disagreement of optical axes of electron lenses of said electron microscope are compensated.

* * * * *